United States Patent
Wang et al.

(10) Patent No.: US 12,051,766 B1
(45) Date of Patent: Jul. 30, 2024

(54) METHOD FOR PREPARING NITRIDE LIGHT EMITTING DIODE (LED) AND NONDESTRUCTIVE INTERFACE SEPARATION

(71) Applicant: Peking University, Beijing (CN)

(72) Inventors: Xinqiang Wang, Beijing (CN); Fang Liu, Beijing (CN); Zhaoying Chen, Beijing (CN); Yucheng Guo, Beijing (CN); Bowen Sheng, Beijing (CN); Duo Li, Beijing (CN); Bo Shen, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 18/279,154

(22) PCT Filed: Aug. 9, 2022

(86) PCT No.: PCT/CN2022/111059
§ 371 (c)(1),
(2) Date: Aug. 28, 2023

(87) PCT Pub. No.: WO2024/026907
PCT Pub. Date: Feb. 8, 2024

(30) Foreign Application Priority Data

Aug. 1, 2022 (CN) .......................... 202210914235.6

(51) Int. Cl.
*H01L 33/00* (2010.01)
*H01L 27/15* (2006.01)

(52) U.S. Cl.
CPC ........ *H01L 33/0093* (2020.05); *H01L 27/156* (2013.01); *H01L 33/007* (2013.01)

(58) Field of Classification Search
CPC .. H01L 33/0093; H01L 27/156; H01L 33/007
See application file for complete search history.

(56) References Cited

U.S. PATENT DOCUMENTS

| 11,551,929 B2 * | 1/2023 | Robinson ............ H01L 21/0254 |
| 2017/0260651 A1 * | 9/2017 | Robinson .......... H01L 21/02444 |

(Continued)

FOREIGN PATENT DOCUMENTS

| CN | 102201332 A | 9/2011 |
| CN | 108922948 A | 11/2018 |

(Continued)

OTHER PUBLICATIONS

"2D materials and van der Waals heterostructures" K. S. Novoselov et al. Science vol. 353 issue 6298 pp. aac9439-1 to aac9439-11 (Year: 2016).*

*Primary Examiner* — Bradley Smith
(74) *Attorney, Agent, or Firm* — Mark C. Johnson; Johnson |Dalal

(57) ABSTRACT

Disclosed is a method for preparing a nitride light emitting diode (LED) and nondestructive interface separation. A two-dimensional atomic crystal layer on a transparent substrate is modified by using an atomic irradiation technology, to obtain an irradiated region; a nitride LED structure is prepared on a modified two-dimensional atomic crystal layer, and a support substrate is cured by means of a metal functional layer; visible laser is incident from a back surface of the transparent substrate to directionally destruct the irradiated region of the two-dimensional atomic crystal layer, so as to obtain a whole structure of the nitride LED structure, the metal functional layer and the support substrate that are separated from the transparent substrate. The present disclosure can nondestructively separate the interface and repeatedly use the transparent substrate.

10 Claims, 3 Drawing Sheets

(56) References Cited

U.S. PATENT DOCUMENTS

2021/0115589 A1* 4/2021 Journot ................. C30B 25/183
2023/0143907 A1* 5/2023 Choi ....................... H01L 33/44
                                                          257/88

FOREIGN PATENT DOCUMENTS

CN      112993103 A    6/2021
JP      2004193371 A   7/2004

* cited by examiner

METHOD FOR PREPARING NITRIDE LIGHT EMITTING DIODE (LED) AND NONDESTRUCTIVE INTERFACE SEPARATION

CROSS REFERENCE TO RELATED APPLICATION

This patent application is a national stage application of International Patent Application No. PCT/CN2022/111059, filed on Aug. 9, 2022, which claims the benefit and priority of Chinese Patent Application No. 202210914235.6, filed with the China National Intellectual Property Administration on Aug. 1, 2022, the disclosure of which is incorporated by reference herein in its entirety as part of the present application.

TECHNICAL FIELD

The present disclosure relates to a technology for preparing a semiconductor light emitting device, and in particular to a method for preparing a nitride light emitting diode (LED) and nondestructive interface separation.

BACKGROUND

A wurtzite nitride semiconductor has a direct gap band structure, of which a band gap is continuously adjustable in a wide range, and carrier recombination efficiency is high. It functions as a preferred material system for preparing ultraviolet and visible light emitting diodes (LEDs) and a micro light emitting diode (micro-LED), and plays a prominent role in the field of solid-state lighting, intelligent display, perceptual detection, biomedicine, etc.

Typically, a nitride LED is prepared on a sapphire substrate through heteroepitaxy. Nitride and sapphire are strongly coupled at an interface in a form of a covalent bond. An upper nitride epitaxial structure is mainly stripped with ultraviolet laser ablation of a bottom layer of gallium nitride (GaN) in industry, so as to prepare a flexible light emitting device, a wearable light emitting device and a micro-LED display chip. However, such a technical route has two drawbacks. Firstly, it is necessary to pre-arrange a GaN sacrificial layer having a thickness ranging from 100 nm to 1000 nm. After ultraviolet laser having a wavelength shorter than 365 nm is absorbed by the sacrificial layer, the upper nitride epitaxial structure is separated by means of thermal decomposition, resulting in material waste and low yield. Secondly, a stripped surface of the nitride epitaxial structure is rough, on which gallium is left. Consequently, it is necessary to additionally grind, polish, and clean the nitride epitaxial structure having a thickness of several microns, resulting in a complex technology and high technology difficulty. If a two-dimensional material transition layer is introduced between the nitride epitaxial structure and the sapphire substrate, a nitride epitaxial structure/two-dimensional material transition layer/sapphire substrate weakly coupled interface will be formed. Through a physical separation method, the weakly coupled interface is destructed, and an interface between the sapphire substrate and the nitride epitaxial structure is separated. However, such a method is limited to a size and interface quality of a separated nitride epitaxial structure, is incompatible with technologies of a production line for the nitride LED and the micro-LED, and is unsuitable for mass production.

SUMMARY

In order to overcome the defects of the prior art above, the present disclosure provides a method for preparing a nitride light emitting diode (LED) and nondestructive interface separation.

A method for preparing a nitride LED and nondestructive interface separation of the present disclosure includes:

1) preparing a two-dimensional atomic crystal template:
   a) providing a transparent substrate, providing an annular edge dividing groove on a back surface of the transparent substrate, and forming a two-dimensional atomic crystal layer on a front surface of the transparent substrate, where the two-dimensional atomic crystal layer is capable of stably existing in a nitride epitaxial temperature interval, layers of the two-dimensional atomic crystal layer are connected by using a pure van der Waals force, and the two-dimensional atomic crystal layer is a layered structure;
   b) forming a submicron pattern mask on a surface of the two-dimensional atomic crystal layer by using an electron beam exposure and evaporation technology, where the submicron pattern mask is provided with a plurality of two-dimensional circular through holes arranged periodically, and the circular through hole has a depth consistent with a thickness of the submicron pattern mask; and
   c) modifying the two-dimensional atomic crystal layer by using an atomic irradiation technology:
   emitting, by utilizing a plasma source, irradiated atoms to bombard the two-dimensional atomic crystal layer having the submicron pattern mask, and modifying a region corresponding to the two-dimensional atomic crystal layer below the circular through hole of the submicron pattern mask to obtain an irradiated region, where layers of the irradiated region are connected in a form of mixing a van der Waals force and a covalent bond, the covalent bond is formed by participation of the irradiated atoms, and the irradiated region is modified from a layered structure to a frame structure; and other two-dimensional atomic crystal layer regions are not bombarded by the irradiated atoms, and are referred to as non-irradiated regions, a layered structure connected by a van der Waals force between layers of the non-irradiated regions is still maintained, the two-dimensional atomic crystal template is formed, the two-dimensional atomic crystal template includes the transparent substrate and a modified two-dimensional atomic crystal layer, and the irradiated region of the modified two-dimensional atomic crystal layer is provided with the frame structure;

2) preparing a nitride LED structure:
   a) controlling a temperature and a flow ratio of a group III source to ammonia gas in a beam flow, and depositing p-type nitride on the two-dimensional atomic crystal template, where the non-irradiated region in the two-dimensional atomic crystal layer does not have an unsaturated covalent bond as a nitride nucleation site, and may not deposit the p-type nitride, and the p-type nitride may be deposited only in the irradiated region having the unsaturated covalent bond, such that a p-type nitride micro-column array is formed on the two-dimensional atomic crystal template; and
   b) changing a deposition condition, where compared with a) of step 2), the temperature is reduced, and the flow ratio of the group III source to the ammonia gas in the beam flow becomes large, continuing to deposit p-type nitride on the p-type nitride micro-column array to form a p-type closure layer having a whole layered structure on the p-type nitride micro-column array, and covering an upper surface of the entire two-dimensional atomic crystal template with the p-type closure layer;

c) depositing a multi-quantum well on the p-type closure layer; and d) depositing an n-type layer on the multi-quantum well, where the p-type nitride micro-column array, the p-type closure layer, the multi-quantum well and the n-type layer form the nitride LED structure;

3) arranging a support substrate:

a) sequentially forming a reflective thin layer, a bonding layer and a connecting layer from bottom to top on the n-type layer of the nitride LED structure, where the reflective thin layer, the bonding layer and the connecting layer form a metal functional layer, the reflective thin layer is configured to reflect visible laser during directional ablation of the visible laser, a melting point of a metal used by the bonding layer is higher than that of a metal used by the connecting layer, the bonding layer uses a metal that easily absorbs nitrogen gas or nitrogen atoms, and is configured to modify the metal functional layer from a metal to a conductive n-type compound in a high-temperature environment, and the connecting layer is configured to be melted after being heated and be cured after being cooled to a room temperature, so as to connect an upper layer and a lower layer in a cured manner on the premise of not forming a compound semiconductor structure; and b) providing the support substrate having the same transverse size as the transparent substrate, placing the support substrate on the connecting layer, and melting and curing the connecting layer to fix the support substrate on the connecting layer, so as to form a composite structure, where the composite structure includes the support substrate, the metal functional layer, the nitride LED structure and the two-dimensional atomic crystal template; and 4) separating the nitride LED structure:

a) cutting off a region on an outer side of the edge dividing groove with an ultraviolet laser ablation technology along the annular edge dividing groove on the back surface of the transparent substrate, carrying out cutting from the transparent substrate to the support substrate, and only retaining a region corresponding to an inner side of the edge dividing groove to prevent edge adhesion; and b) making, by using a visible laser directional ablation technology, visible laser incident from the back surface of the transparent substrate to destruct the irradiated region of the two-dimensional atomic crystal layer, where the covalent bond absorbs the visible light laser more strongly than the van der Waals force, and it may be seen that the visible laser is more strongly absorbed in the irradiated region having the frame structure, such that the irradiated region having the frame structure is increased in temperature and is ablated, and a bottom surface of the p-type nitride micro-column array of the nitride LED structure on an upper layer is separated from the transparent substrate, such that the transparent substrate is nondestructively separated from a whole structure of the nitride LED structure, the metal functional layer and the support substrate to obtain the reusable transparent substrate and the whole structure of the nitride LED structure, the metal functional layer and the support substrate that are separated from the transparent substrate.

In a) of step 1), the transparent substrate is made of double-sided polished sapphire, gallium oxide or diamond, and has a diameter ranging from 50 mm to 300 mm, a thickness ranging from 0.3 mm to 3 mm, and visible light absorptivity less than 1%; the edge dividing groove is formed on the back surface of the transparent substrate by using the ultraviolet laser ablation technology, the edge dividing groove has a depth that is $\frac{1}{3}$-$\frac{2}{3}$ of a thickness of the transparent substrate, and a width ranging from 0.05 mm to 0.2 mm, and a distance between an outer edge of the edge dividing groove and an edge of the transparent substrate is 3 mm to 5 mm; and the two-dimensional atomic crystal layer is formed on the front surface of the transparent substrate by using a deposition or transfer method, and the two-dimensional atomic crystal layer uses single crystal graphene or single crystal boron nitride, is capable of stably existing in the nitride epitaxial temperature interval ranging from 600° C. to 1050° C., and has a thickness ranging from 1 nm to 10 nm.

In b) of step 1), the circular through hole has a diameter ranging from n to 10n, n is a minimum diameter of the circular through hole, 0.5 µm≤n≤50 µm, the circular through hole has a period ranging from 1.5n to 15n, and the submicron pattern mask is made of Ti or Al, and has a thickness ranging from 10 nm to 50 nm.

In c) of step 1), the irradiated atoms emitted by the plasma source are nitrogen plasma or oxygen plasma; and irradiation time and irradiation power of an ion source are controlled, such that an area proportion of the covalent bond exceeds 25%, the longer the irradiation time is, the larger the area proportion of the covalent bond is, and the larger the irradiation power is, the larger the area proportion of the covalent bond is.

In a) of step 2), the temperature is controlled to range from 800° C. to 1350° C., and the flow ratio of the group III source to the ammonia gas in the beam flow ranges from $\frac{1}{4}$ to $\frac{3}{4}$. The group III source is one or more of B, In and Ga. N is provided by the ammonia gas. A p-type is prepared with a magnesium atom doping mode during deposition. A material forming a p-type nitride micro-column is BGaN or BInGaN, where a component of B is less than 10%, and a carrier concentration is higher than $1 \times 10^{18}$ cm$^{-3}$. The p-type nitride micro-column has a height ranging from 300 nm to 1500 nm.

In b) of step 2), the temperature is controlled to range from 750° C. to 1300° C., and the flow ratio of the group III source to the ammonia gas in the beam flow is greater than 1. A material of the p-type closure layer is BGaN or BInGaN, where a component of B is less than 10%, a carrier concentration is higher than $1 \times 10^{18}$ cm$^{-3}$, and a height ranges from 300 nm to 1500 nm.

In c) of step 2), the multi-quantum well includes m layers of InGaN quantum dots having a component of In higher than 20%, and m+1 layers of AlGaN thin layers having a component of Al lower than 20%, 3≤m≤20. The InGaN quantum dot has a height less than 3 nm, the AlGaN thin layer has a height ranging from 5 nm to 15 nm, the InGaN quantum dot is used as a potential well, the AlGaN thin layer is used as a potential barrier, and the InGaN quantum dot overlaps the AlGaN thin layer.

In d) of step 2), the n-type layer is a composite layer consisting of n-type GaN and n-type TiN. The n-type GaN has a thickness ranging from 50 nm to 1000 nm, the n-type TiN has a thickness ranging from 5 nm to 20 nm, the n-type GaN and the n-type TiN both have carrier concentrations higher than $1\times10^{18}$ cm$^{-3}$, and an n-type is prepared with a silicon atom doping mode during deposition.

In a) of step 3), the reflective thin layer is made of Al, and has a thickness ranging from 2 nm to 5 nm, the bonding layer is made of Ti, and has a thickness ranging from 20 nm to 80 nm, and the connecting layer is made of In, is completely melted at 180° C.-300° C., is re-solidified when a temperature of the connecting layer is reduced to a room temperature, and has a thickness ranging from 5 nm to 20 nm.

In b) of step 3), the support substrate is made of corundum, quartz, stainless steel or silicon, and has a thickness exceeding 0.3 mm. The connecting layer is melted at 180° C.-300° C., and is re-solidified to be cured when the temperature of the connecting layer is reduced to the room temperature.

In a) of step 4), upward cutting is carried out by using ultraviolet laser having a wavelength that is not greater than 325 nm along a depth of the annular edge dividing groove, and all structures on the upper layer are cut to divide a space of an inner side and an outer side of the edge dividing groove.

In b) of step 4), visible light band laser having a wavelength ranging from 400 nm to 760 nm is used.

Further, after the nitride LED is obtained, a nitride micro-LED array continues to be prepared. The method includes:
 a) carrying out high-temperature nitrogen treatment on the whole structure of the nitride LED structure, the metal functional layer and the support substrate that are separated, where the bonding layer, the connecting layer on the upper layer and the reflective thin layer on the lower layer become an alloy under a high-temperature condition, the alloy and absorbed nitrogen further form a nitrogen-containing compound, and the nitrogen-containing compound has a property of n-type conductivity, such that the metal functional layer is modified from the metal to the conductive n-type compound, and is separately connected to the support substrate and the nitride LED structure by means of the covalent bond;
 b) depositing a metal mask on a bottom surface of the p-type nitride micro-column array of the nitride LED structure, and etching a gap region of the p-type nitride micro-column array until the n-type compound is exposed below the gap region, where the n-type compound exposed below the gap region of the p-type nitride micro-column array is referred to as a bottom surface platform of the p-type nitride micro-column array; and
 c) depositing a passivation layer on a side wall of the p-type nitride micro-column array of the nitride LED structure, and carrying out etching to remove a passivation layer on the bottom surface platform of the p-type nitride micro-column array, and a passivation layer and the metal mask on the bottom surface of the p-type nitride micro-column array and to retain the passivation layer on the side wall of the p-type nitride micro-column array, so as to obtain the nitride micro-LED array.

In step a), the metal functional layer is treated for 30 min to 100 min in a high-temperature nitrogen atmosphere at 500° C. to 1000° C. to be modified into an n-type compound that is connected to the support substrate and the nitride LED structure by means of the covalent bond, and the metal functional layer becomes n-type $Al_xTi_yIn_{1-x-y}N$, so as to be compatible with a subsequent technology, where a carrier concentration is greater than $5\times10^{19}$ cm$^{-3}$, x is an atomic component of Al, y is an atomic component of Ti, x>0, y>0, and x+y≤1.

In step b), the metal mask is made of Ti, Al or Cu, and has a thickness ranging from 100 nm to 500 nm, and etching uses reactive ion etching or plasma etching.

In step c), the passivation layer is made of $Al_2O_3$, is prepared through a method of pulse laser deposition or atomic layer deposition or magnetron sputtering, and has a thickness ranging from 5 nm to 20 nm; and the metal mask is removed by chemical corrosion of a hydrochloric acid solution, and moreover, the passivation layer on a surface of the metal mask is desorbed.

The present disclosure has the advantages:

the present disclosure can nondestructively separate the interface and repeatedly use the transparent substrate. The method is compatible with an epitaxy and processing technology for the nitride LED and a micro-LED, is applied to manufacturing and separation of a wafer-level nitride LED and a micron-level micro-LED array, and does not need prearrangement of a nitride sacrificial layer, and an additional grinding and polishing technology. The present disclosure is energy-saving, environment-friendly, simple in technology and suitable for mass production.

DETAILED DESCRIPTION OF THE EMBODIMENTS

The present disclosure will be further described below by means of particular embodiments with reference to the accompanying drawings.

Figure 1:
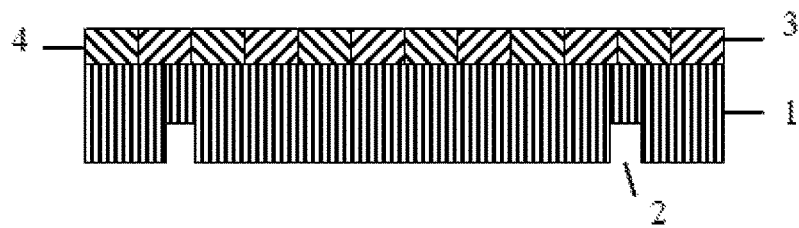
FIG. 1 is a cutaway view of a two-dimensional atomic crystal template obtained through a method for preparing a nitride lighting emitting diode (LED) and nondestructive interface separation according to the present disclosure.
Figure 2:
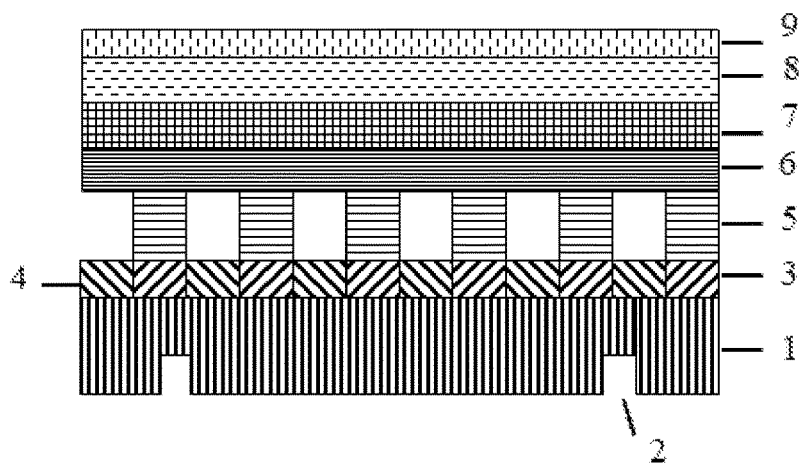
FIG. 2 is a cutaway view of a nitride LED structure obtained through a method for preparing a nitride LED and nondestructive interface separation according to the present disclosure.
Figure 3:
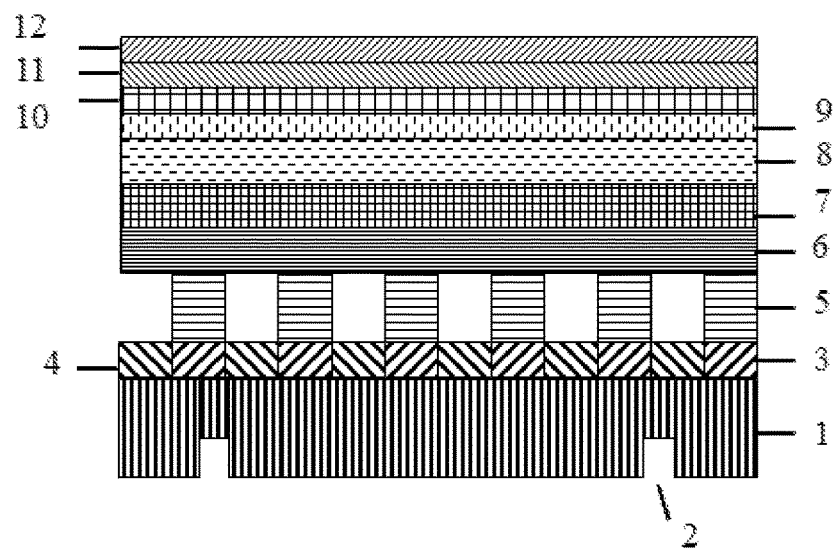
FIG. 3 is a cutaway view of a metal functional layer obtained through a method for preparing a nitride LED and nondestructive interface separation according to the present disclosure.
Figure 4:
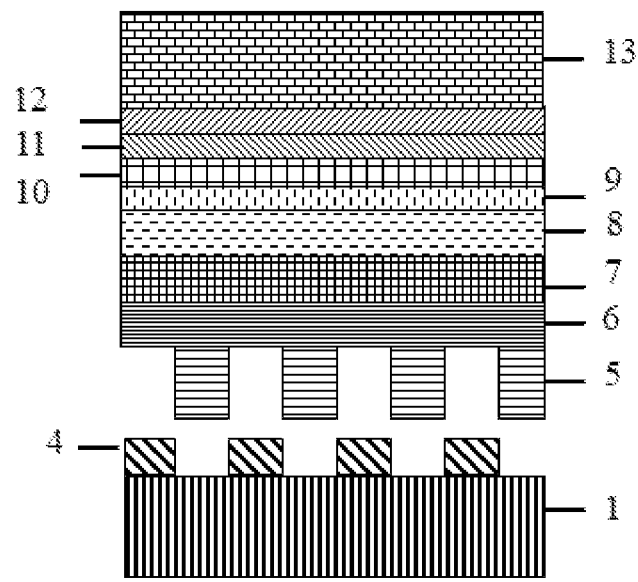
FIG. 4 is a cutaway view of a separated nitride LED structure obtained through a method for preparing a nitride LED and nondestructive interface separation according to the present disclosure.

A method for preparing a nitride light emitting diode (LED) and nondestructive interface separation of the embodiment includes:
 1) prepare a two-dimensional atomic crystal template:
  a) provide a double-sided polished sapphire having a diameter of 200 mm, a thickness of 1.5 mm and visible light absorptivity less than 0.5% as a transparent substrate 1, provide an annular edge dividing groove 2 having a depth that is ½ of the thickness of the transparent substrate, a width of 0.1 mm, and a distance of 4 mm from an edge of the transparent substrate on a back surface of the transparent substrate by using an ultraviolet laser ablation technology, and form a two-dimensional atomic crystal layer on a front surface of the transparent substrate by means of deposition or transfer, where the two-dimensional atomic crystal layer is capable of stably existing in a nitride epitaxial temperature interval, layers of the two-dimensional atomic crystal layer are connected by using a pure van der Waals force, and the two-dimensional atomic crystal layer is a layered structure;

b) form a submicron pattern mask on a surface of the two-dimensional atomic crystal layer by using an electron beam exposure and evaporation technology, where the submicron pattern mask is made of Ti, and has a thickness of 20 nm, the submicron pattern mask is provided with a plurality of two-dimensional circular through holes arranged periodically, and the circular through hole has a depth consistent with a thickness of the submicron pattern mask, a diameter of 1 μm, and a period of 1.5 μm; and c) modify the two-dimensional atomic crystal layer by using an atomic irradiation technology:

emit, by utilizing a plasma source, irradiated atoms to bombard the two-dimensional atomic crystal layer having the submicron pattern mask, and modify a region corresponding to the two-dimensional atomic crystal layer below the circular through hole of the submicron pattern mask to obtain an irradiated region 3, where covalent bonds are generated in some regions of the irradiated region, and van der Waals forces are retained in some regions, such that layers of the irradiated region are connected in a form of mixing the van der Waals force and the covalent bond, the covalent bond is formed by participation of the irradiated atoms, an area proportion of the covalent bond is about 30%, and the irradiated region is modified from a layered structure to a frame structure; and other two-dimensional atomic crystal layer regions are not bombarded by the irradiated atoms, and are referred to as non-irradiated regions 4, a layered structure connected by a van der Waals force between layers of the non-irradiated regions is still maintained, the irradiated region and the non-irradiated region both have a height of 5 nm, the two-dimensional atomic crystal template is formed, and the two-dimensional atomic crystal template includes the transparent substrate and a modified two-dimensional atomic crystal layer, as shown in FIG. 1;

2) prepare a nitride LED structure:

a) control a temperature to 1100° C. and a flow ratio of a group III source to ammonia gas in a beam flow to ½, where the group III source is B and Ga, and deposit p-type BGaN having a thickness of 500 nm on the two-dimensional atomic crystal template, where a carrier concentration is $1\times10^{19}$ cm$^{-3}$, the p-type nitride may not be deposited on the non-irradiated region in the two-dimensional atomic crystal layer, and the p-type nitride may be deposited only on the irradiated region, such that a p-type nitride micro-column array 5 is formed; and b) change a deposition condition, where the temperature is reduced to 1050° C., and the flow ratio of the group III source to the ammonia gas becomes large to 5/4, continue to deposit p-type BGaN on the p-type nitride micro-column array to form a p-type closure layer 6 having a whole layered structure, and cover an upper surface of the entire two-dimensional atomic crystal template with the p-type closure layer having a thickness of 300 nm and a carrier concentration of $3\times10^{19}$ cm$^{-3}$;

c) deposit a multi-quantum well 7 on the p-type closure layer, where five layers of InGaN quantum dots having 25% of a component of In and six layers of AlGaN thin layers having 15% of a component of Al are used as a potential well layer and a potential barrier layer respectively; and d) deposit a GaN layer 8 having a thickness of 200 nm and an n-type TiN thin layer 9 having a thickness of 10 nm on a quantum structure to form an n-type layer, where a carrier concentration is $1\times10^{19}$ cm$^{-3}$, and the p-type nitride micro-column array, the p-type closure layer, the multi-quantum well and the n-type layer form the nitride LED structure, as shown in FIG. 2;

3) arrange a support substrate:

a) sequentially form a reflective thin layer 10 of Al having a thickness of 3 nm, a bonding layer 11 of Ti having a thickness of 50 nm and a connecting layer 12 of In having a thickness of 10 nm on the n-type layer of the nitride LED structure, where the reflective thin layer, the bonding layer and the connecting layer form a metal functional layer, the reflective thin layer is configured to reflect visible laser during directional ablation of the visible laser, the bonding layer easily absorbs nitrogen gas or nitrogen atoms, and is easily modified from a metal to a conductive nitrogen-containing n-type compound in a high-temperature environment, and the connecting layer is melted after being heated and cured after being cooled to a room temperature, so as to connect an upper layer and a lower layer in a cured manner on the premise of not forming a compound semiconductor structure, as shown in FIG. 3; and b) provide a quartz substrate having a diameter of 200 nm and a thickness of 1 mm as the support substrate 13, place the support substrate on the connecting layer, melt the support substrate at 250° C., place a melted support substrate for 10 min, reduce a temperature of the support substrate to a room temperature, and cure the connecting layer to fix the support substrate on the connecting layer, so as to form a composite structure, where the composite structure includes the support substrate, the metal functional layer, the nitride LED structure and the two-dimensional atomic crystal template; and 4) separate the nitride LED structure:

a) cut off a region on an outer side of the edge dividing groove with an ultraviolet laser ablation technology having a wavelength of 266 nm along the annular edge dividing groove on the back surface of the transparent substrate, carry out cutting from the transparent substrate to the support substrate, and only retain a region corresponding to an inner side of the edge dividing groove to prevent edge adhesion; and b) make, by using a visible laser directional ablation technology having a wavelength of 532 nm, visible laser incident from the back surface of the transparent substrate to destruct the irradiated region of the two-dimensional atomic crystal layer, where the covalent bond absorbs the visible light laser more strongly than the van der Waals force, and it may be seen that the visible laser is more strongly absorbed in the irradiated region having the frame structure, such that the irradiated region having the frame structure is increased in temperature and is ablated, and a bottom surface of the p-type nitride micro-column array of the nitride LED structure on an upper layer is separated from the transparent substrate, such that the transparent substrate is nondestructively separated from a whole structure of the nitride LED structure, the metal functional layer and the support substrate to obtain the reusable transparent substrate and the whole structure of the nitride LED structure, the metal functional layer and the support substrate that are separated from the transparent substrate, as shown in FIG. 4.

Figure 5:
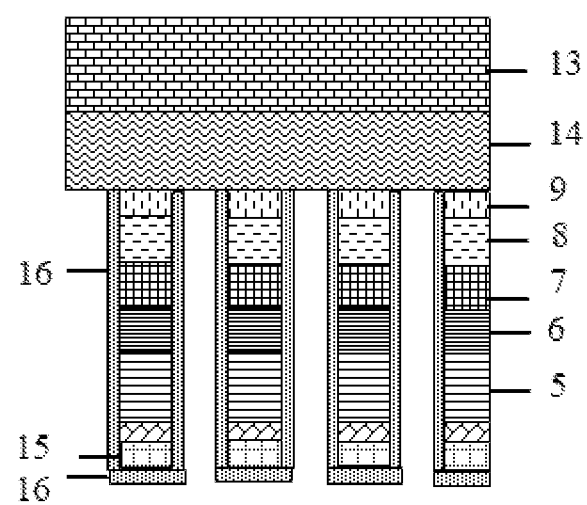
FIG. 5 is a cutaway view of a passivation layer obtained through a method for preparing a nitride LED and nondestructive interface separation according to the present disclosure.
Figure 6:
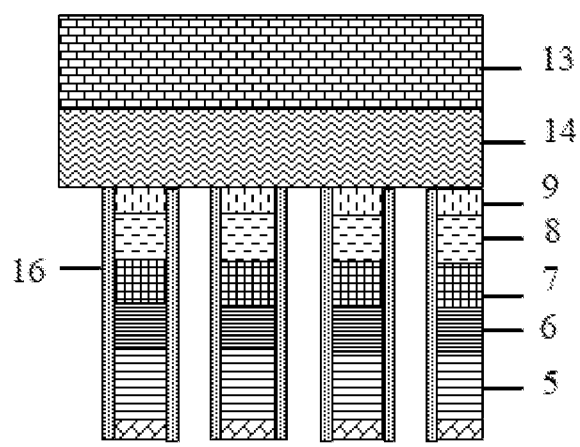
FIG. 6 is a cutaway view of a nitride micro-LED array obtained through a method for preparing a nitride LED and nondestructive interface separation according to the present disclosure.

After the whole structure of the nitride LED structure, the metal functional layer and the support substrate that are separated from the transparent substrate is obtained, a nitride micro-LED array continues to be prepared. The method includes:

a) treat the whole structure of the nitride LED structure, the metal functional layer and the support substrate that are separated for 50 min under a nitrogen condition at 600° C., where Ti of the bonding layer, In of the connecting layer on the upper layer and Al of the reflective thin layer on the lower layer become an alloy under a high-temperature condition, the alloy and absorbed nitrogen further form a nitrogen-containing compound, and due to imbalance of a stoichiometric ratio of the metal and nitrogen, the nitrogen-containing compound has a property of n-type conductivity, such that the metal functional layer is modified from the metal to the conductive n-type compound, and is separately connected to the support substrate and the nitride LED structure by means of the covalent bond, and the metal functional layer is modified to the n-type compound 14, has a material of n-type $Al_{0.05}Ti_{0.85}In_{0.1}N$; and is separately connected to the support substrate and the nitride LED structure by means of the covalent bond;

b) deposit Al having a thickness of 200 nm as a metal mask 15 on a bottom surface of the p-type nitride micro-column array of the nitride LED structure, and etch a gap region of the p-type nitride micro-column array until the n-type compound is exposed below the gap region; and c) deposit $Al_2O_3$ having a thickness of 10 nm as a passivation layer 16 on a side wall of the p-type nitride micro-column array of the nitride LED structure, as shown in FIG. 5, carry out, by using a hydrochloric acid solution, chemical etching to remove a passivation layer on a bottom surface platform of the p-type nitride micro-column array, and the metal mask on the bottom surface of the p-type nitride micro-column array, and desorb a passivation layer on a surface of the metal mask to retain the passivation layer on the side wall of the p-type nitride micro-column array, so as to obtain the nitride micro-LED array, as shown in FIG. 6.

Finally, it should be noted that disclosure of the embodiments is intended to help further understand the present disclosure. However, those skilled in the art can understand that various substitutions and modifications may be made without departing from the spirit and scope of the present disclosure and the appended claims. Therefore, the present disclosure should not be limited to the content disclosed in the embodiments, and the scope of protection claimed by the present disclosure is subject to the scope defined by the claims.

What is claimed is:

1. A method for preparing a nitride light emitting diode (LED) and nondestructive interface separation, comprising:

1) Preparing a two-dimensional atomic crystal template:

a) providing a transparent substrate, providing an annular edge dividing groove on a back surface of the transparent substrate, and forming a two-dimensional atomic crystal layer on a front surface of the transparent substrate, wherein the two-dimensional atomic crystal layer is capable of stably existing in a nitride epitaxial temperature interval, layers of the two-dimensional atomic crystal layer are connected by using a pure van der Waals force, and the two-dimensional atomic crystal layer is a layered structure;

b) forming a submicron pattern mask on a surface of the two-dimensional atomic crystal layer by using an electron beam exposure and evaporation technology, wherein the submicron pattern mask is provided with a plurality of two-dimensional circular through holes arranged periodically, and the circular through hole has a depth consistent with a thickness of the submicron pattern mask; and c) modifying the two-dimensional atomic crystal layer by using an atomic irradiation technology:

emitting, by utilizing a plasma source, irradiated atoms to bombard the two-dimensional atomic crystal layer having the submicron pattern mask, and modifying a region corresponding to the two-dimensional atomic crystal layer below the circular through hole of the submicron pattern mask to obtain an irradiated region, wherein layers of the irradiated region are connected in a form of mixing a van der Waals force and a covalent bond, the covalent bond is formed by participation of the irradiated atoms, and the irradiated region is modified from a layered structure to a frame structure; and other two-dimensional atomic crystal layer regions are not bombarded by the irradiated atoms, and are referred to as non-irradiated regions, a layered structure connected by a van der Waals force between layers of the non-irradiated regions is still maintained, the two-dimensional atomic crystal template is formed, the two-dimensional atomic crystal template comprises the transparent substrate and a modified two-dimensional atomic crystal layer, and the irradiated region of the modified two-dimensional atomic crystal layer is provided with the frame structure;

2) Preparing a nitride LED structure:

a) controlling a temperature and a flow ratio of a group III source to ammonia gas in a beam flow, and depositing p-type nitride on the two-dimensional atomic crystal template to form a p-type nitride micro-column array on the irradiated region of the modified two-dimensional atomic crystal layer of the two-dimensional atomic crystal template; and b) changing a deposition condition, wherein compared with a) of step 2), the temperature is reduced, and the flow ratio of the group III source to the ammonia gas in the beam flow becomes large, continuing to deposit p-type nitride on the p-type nitride micro-column array to form a p-type closure layer having a whole layered structure on the p-type nitride micro-column array, and covering an upper surface of the entire two-dimensional atomic crystal template with the p-type closure layer;

c) depositing a multi-quantum well on the p-type closure layer; and d) depositing an n-type layer on the multi-quantum well, wherein the p-type nitride micro-column array, the p-type closure layer, the multi-quantum well and the n-type layer form the nitride LED structure;

3) Arranging a support substrate:

a) sequentially forming a reflective thin layer, a bonding layer and a connecting layer from bottom to top on the n-type layer of the nitride LED structure, wherein the reflective thin layer, the bonding layer and the connecting layer form a metal functional layer, the reflective thin layer is configured to reflect visible laser during directional ablation of the visible laser, is made of Al, and has a thickness ranging from 2 nm to 5 nm, a melting point of a metal used by the bonding layer is higher than that of a metal used by the connecting layer, the bonding layer uses a metal that easily absorbs nitrogen gas or nitrogen atoms, and is configured to modify the metal functional layer from a metal to a conductive n-type compound in a high-temperature environment, and the connecting layer is configured to be melted after being heated and be cured after being cooled to a room temperature, so as to connect an upper layer and a lower layer in a cured manner on the premise of not forming a compound semiconductor structure; and b) providing the support substrate having the same transverse size as the transparent substrate, placing the support substrate on the connecting layer, and melting and curing the connecting layer to fix the support substrate on the connecting layer, so as to form a composite structure, wherein the composite structure comprises the support substrate, the metal functional layer, the nitride LED structure and the two-dimensional atomic crystal template; and 4) Separating the nitride LED structure:

a) cutting off a region on an outer side of the edge dividing groove with an ultraviolet laser ablation technology along the annular edge dividing groove on the back surface of the transparent substrate, carrying out cutting from the transparent substrate to the support substrate, and only retaining a region corresponding to an inner side of the edge dividing groove to prevent edge adhesion; and b) making, by using a visible laser directional ablation technology, visible laser incident from the back surface of the transparent substrate to destruct the irradiated region of the two-dimensional atomic crystal layer, wherein the transparent substrate is nondestructively separated from a whole structure of the nitride LED structure, the metal functional layer and the support substrate to obtain the reusable transparent substrate and the whole structure of the nitride LED structure, the metal functional layer and the support substrate that are separated from the transparent substrate.

2. The method for preparing a nitride LED and nondestructive interface separation according to claim 1, wherein in a) of step 1), the transparent substrate is made of double-sided polished sapphire, gallium oxide or diamond, and has a diameter ranging from 50 mm to 300 mm, a thickness ranging from 0.3 mm to 3 mm, and visible light absorptivity less than 1%; the edge dividing groove is formed on the back surface of the transparent substrate by using the ultraviolet laser ablation technology, the edge dividing groove has a depth that is ⅓-⅔ of a thickness of the transparent substrate, and a width ranging from 0.05 mm to 0.2 mm, and a distance between an outer edge of the edge dividing groove and an edge of the transparent substrate is 3 mm to 5 mm; and the two-dimensional atomic crystal layer is formed on the front surface of the transparent substrate by using a deposition or transfer method, and the two-dimensional atomic crystal layer uses single crystal graphene or single crystal boron nitride, is capable of stably existing in the nitride epitaxial temperature interval ranging from 600° C. to 1050° C., and has a thickness ranging from 1 nm to 10 nm.

3. The method for preparing a nitride LED and nondestructive interface separation according to claim 1, wherein in b) of step 1), the circular through hole has a diameter ranging from n to 10n, n is a minimum diameter of the circular through hole, 0.5 µm≤n≤50 µm, the circular through hole has a period ranging from 1.5n to 15n, and the submicron pattern mask is made of Ti or Al, and has a thickness ranging from 10 nm to 50 nm.

4. The method for preparing a nitride LED and nondestructive interface separation according to claim 1, wherein in a) of step 2), the temperature is controlled to range from 800° C. to 1350° C., and the flow ratio of the group III source to the ammonia gas in the beam flow ranges from ¼ to ¾.

5. The method for preparing a nitride LED and nondestructive interface separation according to claim 1, wherein in b) of step 2), the temperature is controlled to range from 750° C. to 1300° C., and the flow ratio of the group III source to the ammonia gas in the beam flow is greater than 1.

6. The method for preparing a nitride LED and nondestructive interface separation according to claim 1, wherein in a) of step 3), the bonding layer is made of Ti, and has a thickness ranging from 20 nm to 80 nm, and the connecting layer is made of In, and has a thickness ranging from 5 nm to 20 nm.

7. The method for preparing a nitride LED and nondestructive interface separation according to claim 1, wherein in b) of step 3), the support substrate is made of corundum, quartz, stainless steel or silicon, and has a thickness exceeding 0.3 mm.

8. The method for preparing a nitride LED and nondestructive interface separation according to claim 1, wherein in b) of step 4), visible light band laser having a wavelength ranging from 400 nm to 760 nm is used.

9. The method for preparing a nitride LED and nondestructive interface separation according to claim 1, wherein in order to further obtain a nitride micro-LED array, the method comprises:

a) carrying out high-temperature nitrogen treatment on the whole structure of the nitride LED structure, the metal functional layer and the support substrate that are separated, wherein the bonding layer, the connecting layer on the upper layer and the reflective thin layer on the lower layer become an alloy under a high-temperature condition, the alloy and absorbed nitrogen further form a nitrogen-containing compound, and the nitrogen-containing compound has a property of n-type conductivity, such that the metal functional layer is modified from the metal to the conductive n-type compound, and is separately connected to the support substrate and the nitride LED structure by means of the covalent bond;

b) depositing a metal mask on a bottom surface of the p-type nitride micro-column array of the nitride LED structure, and etching a gap region of the p-type nitride micro-column array until the n-type compound is exposed below the gap region, wherein the n-type compound exposed below the gap region of the p-type nitride micro-column array is referred to as a bottom surface platform of the p-type nitride micro-column array; and c) depositing a passivation layer on a side wall of the p-type nitride micro-column array of the nitride LED structure, and carrying out etching to remove a passivation layer on the bottom surface platform of the p-type nitride micro-column array, and a passivation layer and the metal mask on the bottom surface of the p-type nitride micro-column array and to retain the passivation layer on the side wall of the p-type nitride micro-column array, so as to obtain the nitride micro-LED array.

10. The method for preparing a nitride LED and nondestructive interface separation according to claim 9, wherein in step a), the metal functional layer is treated for 30 min to 100 min in a high-temperature nitrogen atmosphere at 500° C. to 1000° C. to be modified into an n-type compound that is connected to the support substrate and the nitride LED structure by means of the covalent bond, and the metal functional layer becomes n-type $Al_xTi_yIn_{1-x-y}N$, wherein x is an atomic component of Al, y is an atomic component of Ti, x>0, y>0, and x+y≤1.

* * * * *